(12) United States Patent
Chiang et al.

(10) Patent No.: US 7,749,006 B2
(45) Date of Patent: Jul. 6, 2010

(54) LOCKING HANDLE

(75) Inventors: Li-Fu Chiang, Yonghe (TW); Yu-Hsu Sun, Taipei (TW)

(73) Assignee: Nextronics Engineering Corp., Taipei County (TW)

( * ) Notice: Subject to any disclaimer, the term of this patent is extended or adjusted under 35 U.S.C. 154(b) by 125 days.

(21) Appl. No.: 12/230,812

(22) Filed: Sep. 5, 2008

(65) Prior Publication Data

US 2009/0181568 A1   Jul. 16, 2009

(30) Foreign Application Priority Data

Jan. 16, 2008   (TW) .............................. 97201005 U

(51) Int. Cl.
*H01R 13/62* (2006.01)

(52) U.S. Cl. ..................................... 439/160

(58) Field of Classification Search ................ 439/159, 439/160, 157, 328, 372, 325; 361/756; 24/458
See application file for complete search history.

(56) References Cited

U.S. PATENT DOCUMENTS

| | | | |
|---|---|---|---|
| 5,848,906 A * | 12/1998 | Glusker et al. .............. 439/157 |
| 6,551,120 B2 * | 4/2003 | Daskalakis et al. .......... 439/328 |
| 7,159,283 B2 * | 1/2007 | Chang et al. ................... 24/458 |
| 7,265,968 B2 * | 9/2007 | Champion et al. ...... 361/679.01 |
| 2003/0026062 A1 * | 2/2003 | Kim ........................... 361/327 |
| 2004/0077198 A1 * | 4/2004 | Schlack ....................... 439/160 |
| 2004/0192095 A1 * | 9/2004 | Joist ............................ 439/188 |
| 2008/0146062 A1 * | 6/2008 | Bridges et al. .............. 439/325 |

* cited by examiner

*Primary Examiner*—Alexander Gilman
(74) *Attorney, Agent, or Firm*—Rosenberg, Klein & Lee

(57) ABSTRACT

A locking handle for fixing a motherboard of a framework includes a locking part, a shell, an elastic part, and a fixing part. The locking part has an extending portion. The extending portion is projecting from the other side of the main portion. The extending portion has a stopping portion. The shell has an accommodating space inside. The shell is assembled with the extending portion slidingly. A hook and A hole are formed at a side of the shell. The hole is through the accommodating space. A grip is integrally formed at an end of the shell. The elastic part is disposed in the accommodating space. The elastic part is compressed between the fixing part and the stopping portion. The operation is easier. Moreover, the cost of manufacturing is saved.

6 Claims, 7 Drawing Sheets

LOCKING HANDLE

BACKGROUND OF THE INVENTION

1. Field of the Invention

The present invention relates to a locking handle and more particular to an improved locking handle for fixing a motherboard and preventing the motherboard from taking out of a computer framework as the computer is running.

2. Description of Related Art

Please refer to FIGS. 1 and 2. Conventional locking handle includes locking part 1a, a shell 2a, a spring 3a, and a grip 4a. The locking part 1a has a main portion 11a, a first protrusion 12a, a second protrusion 13a, and an extending portion 14a. The main portion 11a has a through hole 11a. The locking handle is pivotedly connected with a motherboard (FIG. 6) via the through hole 111a (screwing the locking handle to the motherboard). The first protrusion 12a and the second protrusion 13a are projecting from one end of the main portion 11a. The extending portion 14a is projecting from the other end of the main portion 11a.

A space 21a is formed in the shell 2a. A stopping portion 22a is formed on the inner wall of the shell 2a. A hook 23a is projecting out of a side of the shell 2a. The extending portion 14a of the locking part 1a pass through the space 2 1a of the shell 2a. The hook 23a can lock the interface card.

The spring 3a is disposed in the space 21a of the shell 2a and above the extending portion 14a. The grip 4a has a rib 41a. The grip 4a is assembled at the end of the extending portion 14a. The spring 3a is compressed between the stopping portion 22a and the rib 41a.

The locking handle is pivoting connected with the motherboard via the through hole 111a (screwing the locking handle to the interface card). When the motherboard is installed in a computer framework (FIG. 6), the locking handle can be rotated counter clockwise to engage hook 23a with the motherboard 62. Then, the first protrusion 12a and the second protrusion 13a can fix the computer framework. When the motherboard is token out, users need to pull the shell 2a to make it move relative to the locking part 1a. The spring 3a is compressed to disengage the hook 23a from the interface card. Then the locking handle is rotated clockwise to make the first protrusion 12a and the second protrusion 13a out of clamping the computer framework.

Manufacturers need to manufacture several sets of molds for the locking part 1a, the shell 2a, the spring 3a and the grip 4a. Hence, the cost is high. Besides, users need to press against the grip 4a by their thumb first, and pull the shell 2a to compress the spring 3a by their forefinger. Thus, the hook 23a can lock the motherboard or depart from locking the interface card. The operation is inconvenient.

Therefore, in view of this, the inventor proposes the present invention to overcome the above problems based on his expert experience and deliberate research.

SUMMARY OF THE INVENTION

The object of the present invention is to provide an improved locking handle that can save the molding costs and make users operate conveniently.

For achieving the object described above, the present invention provides a locking handle, which includes a locking part. The locking part has a main portion, a first protrusion, a second protrusion, and an extending portion. The main portion has a hole. The first protrusion and the second protrusion are projecting from one end of the main portion. The extending portion is projecting from the other end of the main portion opposite to the first protrusion. The extending portion has a stopping portion. A shell having an accommodating space inside is assembled with the extending portion slidingly. The extending portion stretches to the accommodating space. A hook and a hole are formed at a side of the shell. The hole is through the accommodating space. A grip is integrally formed at an end of the shell. An elastic part is disposed in the accommodating space. A fixing part is disposed in the hole of the shell and stretches to the accommodating space. The elastic part is compressed between the fixing part and the stopping portion.

The present invention has advantageous effects as follows. The grip is integrally formed at an end of the shell. Thus, the grip and the shell can use the same molding. Thus, the molding costs are reduced. The fixing part is disposed in the hole of the shell and stretches to the accommodating space of the shell. The elastic part is compressed between the fixing part and the stopping portion. Users can pull the grip to move the shell relative to the locking part and compress the elastic part, and thus lock the hook. The operation is easier compared to the prior art.

In order to further understand the characteristics and technical contents of the present invention, a detailed description is made with reference to the accompanying drawings. However, it should be understood that the drawings are illustrative only but not used to limit the present invention thereto.

DETAILED DESCRIPTION OF PREFERRED EMBODIMENTS

Figure 1:
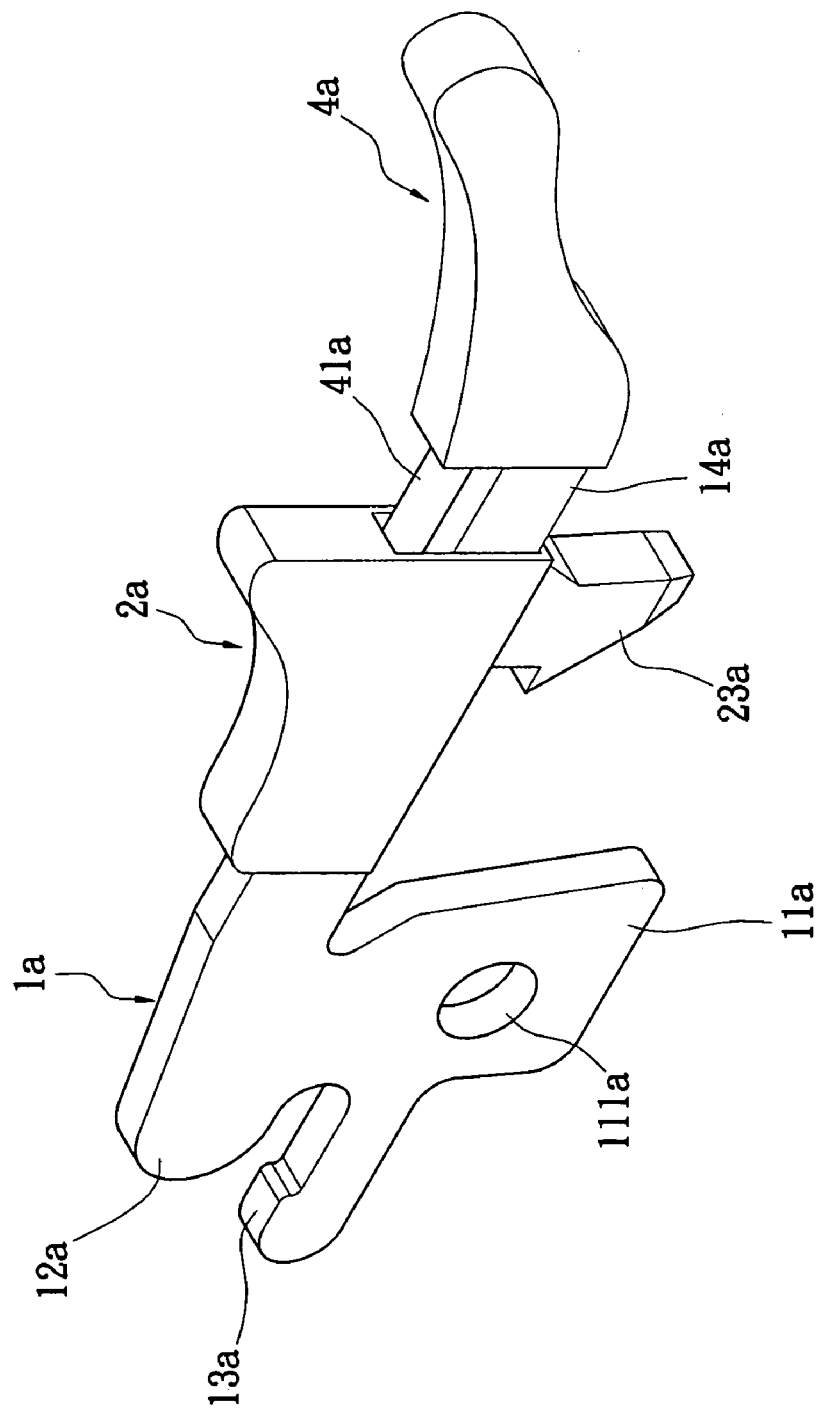
FIG. 1 is an perspective view showing the locking handle of the prior art.
Figure 2:
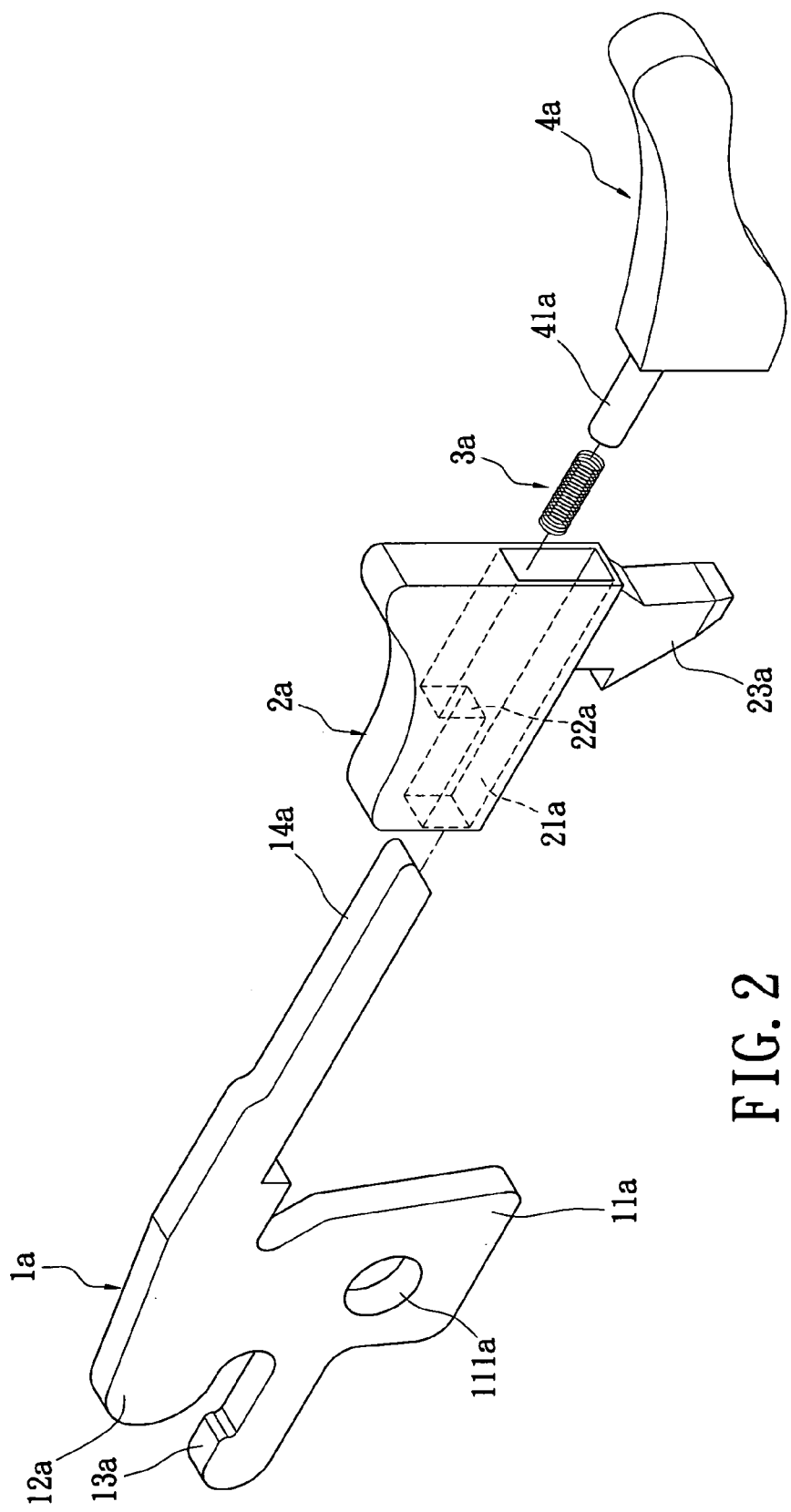
FIG. 2 is an exploded perspective view showing the locking handle of the prior art.
Figure 3:
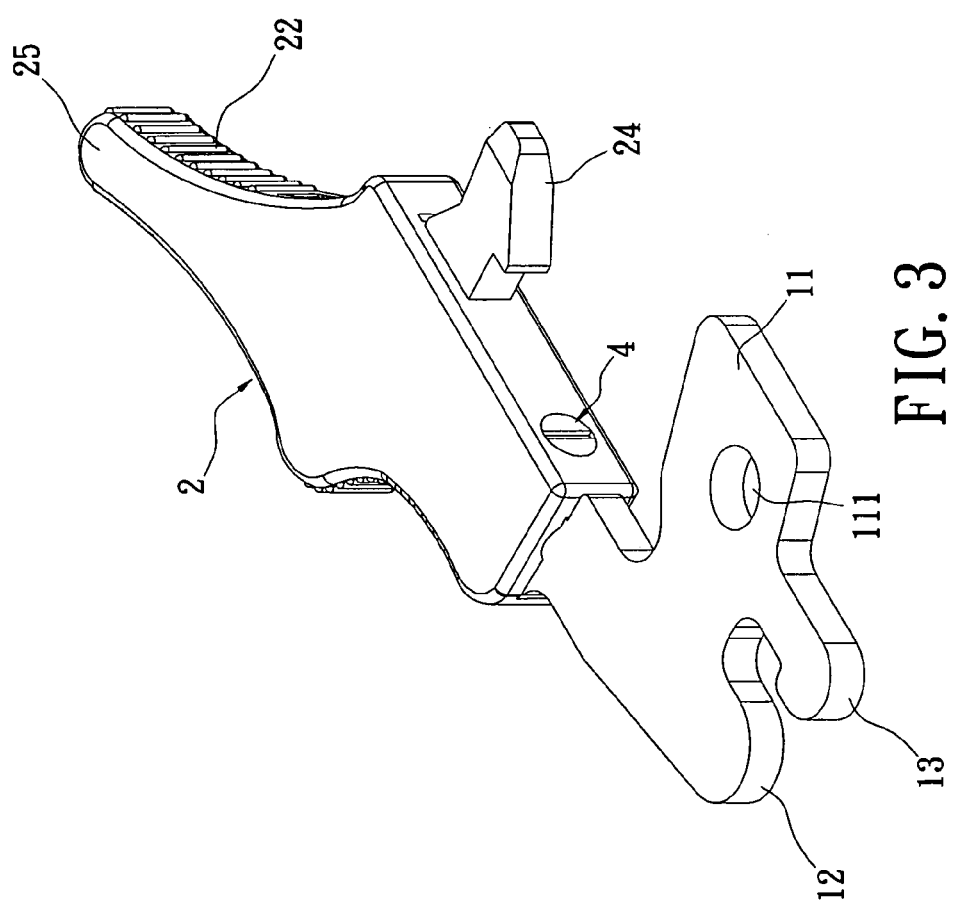
FIG. 3 is an assembled perspective view showing the locking handle of the present invention.
Figure 4:
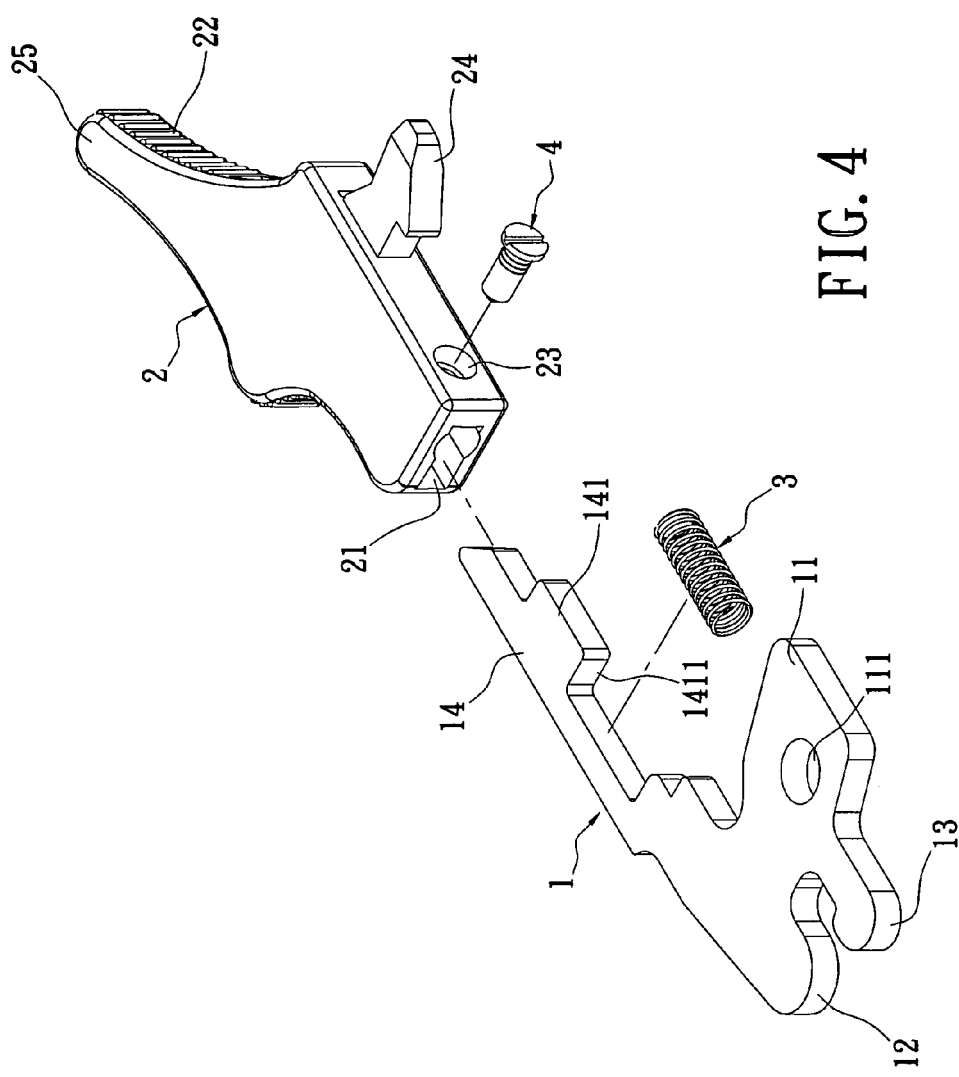
FIG. 4 is an exploded perspective view showing the locking handle of the present invention.
Figure 5:
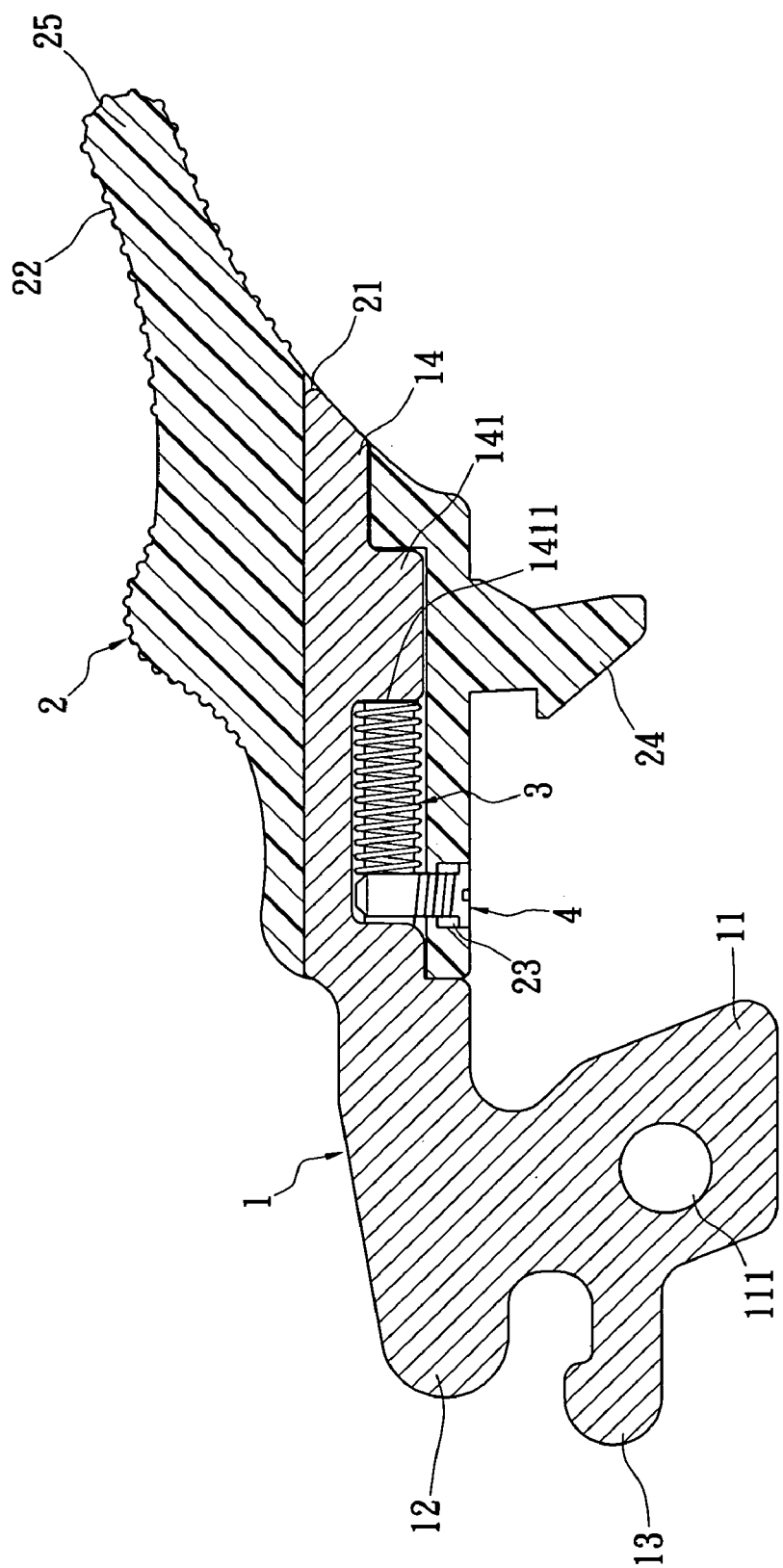
FIG. 5 is a sectional view showing the locking handle of the present invention.

Please refer to FIGS. 3 to 5. The present invention is to provide a locking handle which includes a locking part 1, a shell 2, an elastic part 3 and a fixing part 4. In this embodiment, the locking part 1 is made of hard metal. The locking part 1 has a main portion 11, a first protrusion 12, a second protrusion 13, and an extending portion 14. The main portion 11 has a through hole 111. The first protrusion 12 and the second protrusion 13 are projecting from one end of the main portion 11. The second protrusion 13 is somewhat longer than the first protrusion 12. The extending portion 14 is projecting from the end of the main portion 11 opposite the end having the protrusions 12 and 13. The extending portion 14 has a stopping portion 141. The stopping portion 141 close to the main portion 11 is formed a stopping surface 1411.

In this embodiment, the shell 2 is made of plastics, but the shell 2 can be made of other insulating materials. The shell 2 having an accommodating space 21 inside is assembled with the extending portion 14 of the locking part 1 slidingly. The extending portion 14 stretches to the accommodating space 21. The edge of the shell 2 has a plurality of ratchets 22. A hook 24 and a hole 23 are formed at a side of the shell 2. The hole 23 is through the accommodating space 21. The hook 24 is for locking. A grip 25 is integrally formed at an end of the shell 2 and can be pulled by users.

In this embodiment, the elastic part 3 is a spring. The elastic part 3 is disposed in the accommodating space 21 of the shell 2.

In this embodiment, the fixing part 4 is a screw. The fixing part 4 is screwed in the hole 23 of the shell 2 and stretches to the accommodating space 21. The elastic part 3 is compressed between the stopping surface 1411 of the stopping portion 141 and the fixing part 4.

Figure 6:
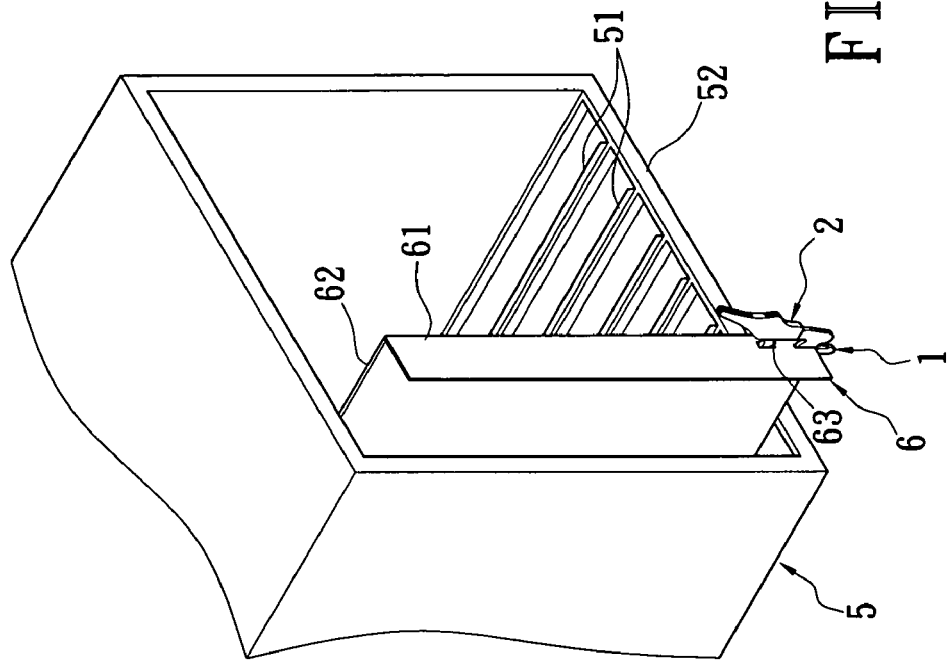
FIG. 6 is an assembled perspective view showing the locking handle of the present invention under normal usage.
Figure 7:
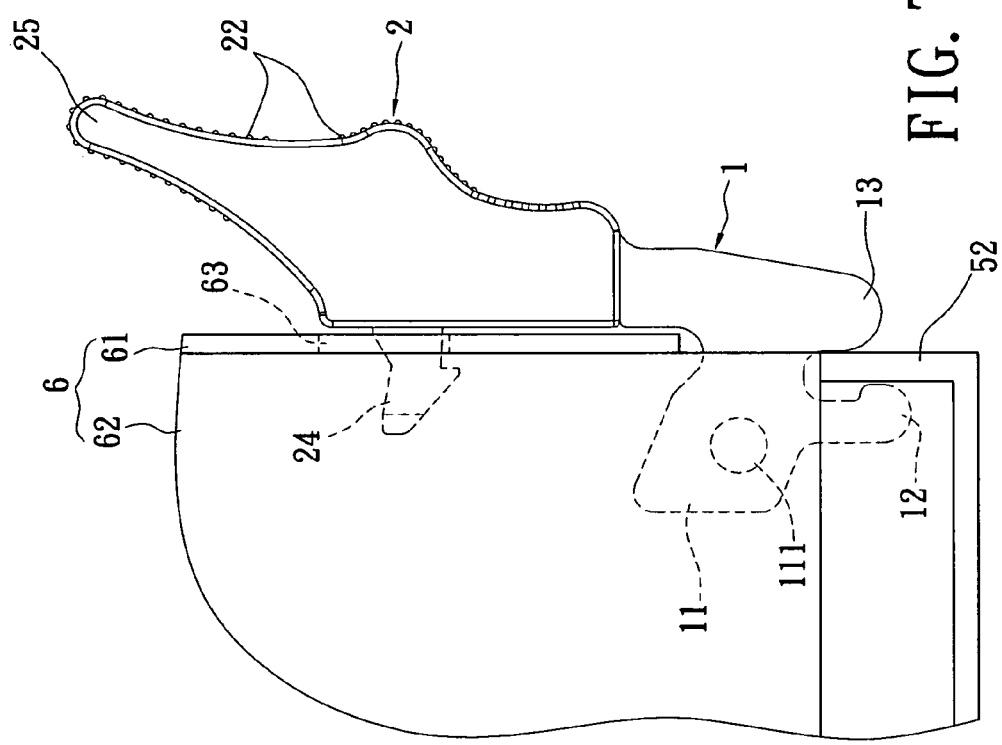
FIG. 7 is a sectional view showing the locking handle of the present invention under normal usage.

Please referring to FIG. 6 and FIG. 7. The locking handle of the present invention is for locking a motherboard 6 in a framework 5. The framework 5 is a computer framework for industrial usage. The framework 5 has a plurality of tracks 51 and a protruding wall 52. The track 51 is for guiding the motherboard 6 into the framework 5. The motherboard 6 comprises a panel 61 and a circuit board 62. The panel 61 has several ports (not shown in Figs) and a locking hole 63. The ports can be connected with other lines or devices. The circuit board 62 is set at one side of the panel 61. The other side of the circuit board 62 can insert into the framework 5. The locking handle is pivotedly connected with an end of the panel 61 via a through hole 111 (screwing the locking handle to the interface card). The hook 24 of the locking handle can be rotated into the locking hole 63 of the panel 61.

When the motherboard 6 is set in the framework 5. The locking handle can be rotated counter clockwise. Pull the grip 25 to move the shell 2 relative to the locking part 1 and press the elastic part 3. Thus, the hook 24 can be rotated into the locking hole 63 of the panel 61. When releasing the grip 25, the hook 24 would lock the panel 61 due to the elastic force. The protruding wall 52 of the framework 5 is clamped between the first protrusion 12 and the second protrusion 13. The motherboard 6 is fixed thereby. As a result, it can be prevented that the motherboard 6 is taken out by mistake as it is operating. This will in turn prevent the motherboard 6 from being damaged. Users can take out the motherboard 6 from the framework 5 by pulling the grip 25, moving the shell 2 relative to the locking part 1 and pressing the elastic part 3, making the hook 24 depart from locking the panel 61, rotating the locking handle clockwise to make the protruding wall 52 out of clamping. The hook 24 is rotated out the locking hole 63.

The grip 25 of the present invention is integrally formed at an end of the shell 2. Thus, the grip 25 and the shell 2 can use the same molding. The costs for molding are saved. The fixing part 4 is screwed in the hole 23 of the shell 2 and stretches to the accommodating space 21 of the shell 2. The elastic part 3 is compressed between the fixing part 4 and the stopping surface 1411 of the stopping portion 141. Users can pull the grip 25 directly to move the shell 2 relative to the locking part 1 and press the elastic part 3 to make the hook 24 lock the panel 61 or depart from locking the panel 61. The operation is easier.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A locking handle, including:
   a locking part which has a main portion, a first protrusion, a second protrusion, and an extending portion having a stopping portion, the main portion having a through hole, the first protrusion and the second protrusion projecting from one end of the main portion, the extending portion projecting from the other end of the main portion opposite to the first and second protrusion;
   a shell which has an accommodating space inside being assembled with the extending portion slidingly, the extending portion stretching to the accommodating space, a hook and a hole being formed at a side of the shell, the hole being through the accommodating space, a grip being integrally formed at an end of the shell;
   a elastic part being disposed in the accommodating space; and
   a fixing part being disposed in the hole of the shell and stretching to the accommodating space, the elastic part being compressed between the fixing part and the stopping portion.

2. The locking handle according to claim 1, wherein the fixing part is screwed into the hole of the shell.

3. The locking handle according to claim 1, wherein the stopping portion has a stopping surface, and the elastic part is compressed between the fixing part and the stopping surface of the stopping portion.

4. The locking handle according to claim 1, wherein the edge of the shell has a plurality of ratchets.

5. The locking handle according to claim 1, wherein the locking handle further includes a computer framework and an interface card, the motherboard being set in the computer framework and comprising a panel and a circuit board, the circuit board being set at a side of the panel, the locking handle being pivotedly connected to an edge of the panel.

6. The locking handle according to claim 5, wherein the framework has a protruding wall, the protruding wall can be clamped between the first protrusion and the second protrusion, the panel has a locking hole, and the hook of the locking handle can be rotated in the locking hole and lock the panel.

* * * * *